United States Patent

Steiner et al.

[11] Patent Number: 5,854,739
[45] Date of Patent: *Dec. 29, 1998

[54] LONG FIN OMNI-DIRECTIONAL HEAT SINK

[75] Inventors: Ronald E. Steiner, Agoura Hills; Peter S. Chow, Burbank, both of Calif.

[73] Assignee: International Electronic Research Corp., Burbank, Calif.

[*] Notice: This patent issued on a continued prosecution application filed under 37 CFR 1.53(d), and is subject to the twenty year patent term provisions of 35 U.S.C. 154(a)(2).

[21] Appl. No.: 602,487

[22] Filed: Feb. 20, 1996

[51] Int. Cl.$^6$ .................................................. H05K 7/20
[52] U.S. Cl. ...................... 361/703; 165/80.3; 174/16.3; 257/722
[58] Field of Search .................................. 165/80.3, 185, 165/151, 152, DIG. 487, DIG. 505; 174/16.3; 257/721, 722; 361/697, 705, 704, 709–711, 717–719

[56] References Cited

U.S. PATENT DOCUMENTS

| | | | |
|---|---|---|---|
| 4,879,891 | 11/1989 | Hinshaw | 72/254 |
| 4,884,331 | 12/1989 | Hinshaw | 29/558 |
| 5,058,665 | 10/1991 | Harada | 165/164 |
| 5,208,731 | 5/1993 | Blomquist | 361/386 |
| 5,369,301 | 11/1994 | Hayashi | 361/703 |
| 5,381,859 | 1/1995 | Minakami | 165/80.3 |
| 5,421,406 | 6/1995 | Furusawa | 361/703 |
| 5,564,497 | 10/1996 | Fukuoka | 165/152 |

FOREIGN PATENT DOCUMENTS

| | | | |
|---|---|---|---|
| 5048282 | 2/1993 | Japan | 361/703 |

*Primary Examiner*—Gerald Tolin
*Attorney, Agent, or Firm*—Bruce A. Jagger

[57] ABSTRACT

A heat sink adapted to dissipate heat from an electronic component wherein a plurality of heat dissipating perforated fins project generally outwardly from a planar base and are spaced apart by channels therebetween. The height of the perforated fins to the width of the channels is at least about 8 to 1. The perforations through the fins are such that the flow of cooling fluid through the fins generally emulates the flow through a comparable pin grid array heat sink. The fin structure is such that the fin is structurally supported against deformation, particularly during cross-cutting operations.

16 Claims, 2 Drawing Sheets

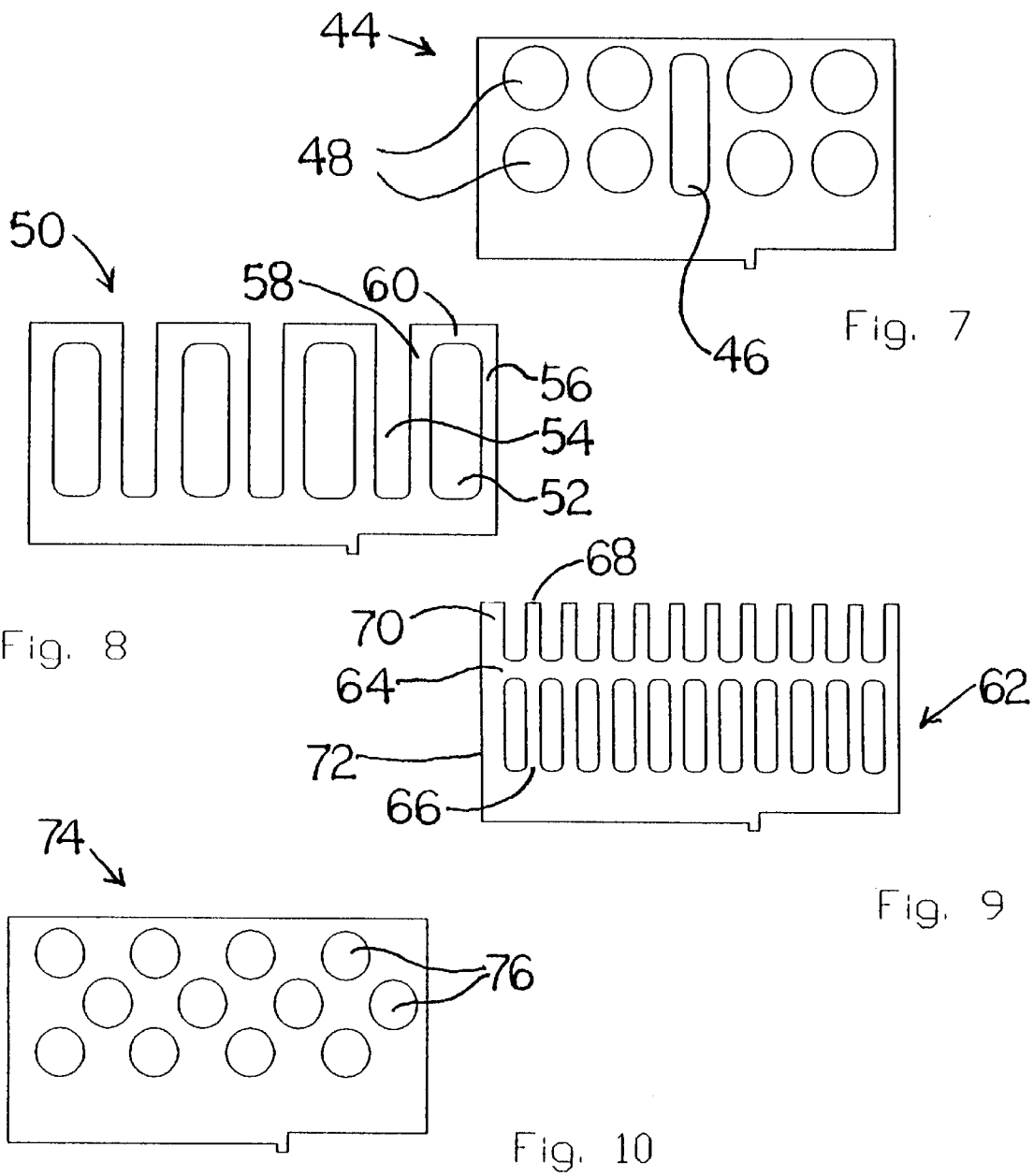

LONG FIN OMNI-DIRECTIONAL HEAT SINK

BACKGROUND OF THE INVENTION

1. Field of the Invention.

The invention relates in general to heat sinks and, in particular, to perforated fin heat sinks for cooling electronic components wherein the perforated fins are structurally supported against longitudinal deforming forces.

As used herein, the term "aspect ratio", as applied to a pin or a fin, will be understood by those skilled in the art to mean the height of the pin or fin divided by the thickness of that pin or fin. The term "projection ratio" will be understood to mean the height of the pin or fin divided by the width of the space or channel between adjacent pins or fins. The term "free flow area ratio" will be understood to mean the total surface area of the perforations in a fin divided by the total surface area of that fin.

2. Description of the Prior Art.

Various pin grid array heat sinks had been proposed previously and various expedients had been suggested for increasing the aspect ratio of the pins. Such previous expedients include, for example, Blomquist U.S. Pat. No. 5,208,731, and Hinshaw U.S. Pat. Nos. 4,879,891 and 4,884,331.

Pin and fin aspect ratios in excess of about 10:1 had generally been considered to be impractical to produce because of the difficulty and expense in forming high aspect ratio pins. Likewise, projection ratios in excess of about 8:1 had generally been considered to be impractical to produce. Such long, thin, closely spaced pins had generally deformed during formation. In general, pin grid array heat sinks are formed by extruding a bar which has the profile of the desired heat sink in one direction. Generally, the extruded bar exhibits a plurality of fins extending longitudinally of the bar and projecting outwardly from a base. The bar is then cross-cut laterally across the fins to form the pins. At fin aspect ratios of greater than about 10:1 the fins become very difficult to form by extrusion. At pin aspect ratios of greater than about 10:1 the cross-cutting operation risks bending or otherwise deforming the long slender pins. Further, the heat dissipation characteristics of the pin grid array heat sinks had often not exhibited the desired improvement with increasing pin aspect ratios.

Pin grid array heat sinks had generally been used in preference to solid finned heat sinks because the pin grid arrays accept the lateral omni-directional flow of cooling fluid, whereas the solid fins tend to perform best with the flow of cooling fluid directed axially along the solid fins.

Those concerned with these problems recognize the need for an improved pin grid array like heat sink with improved cooling capacities and which will accommodate the omni-directional lateral flow of cooling fluid.

BRIEF SUMMARY OF THE INVENTION

A preferred embodiment of the heat dissipating members or heat sinks according to the present invention comprises a heat sink in which perforated panels or fins provide fin aspect ratios of as much as approximately 30:1 or even greater. The perforations in the panel or fin permit cooling the heat sink by a flow of fluid from any lateral direction, that is, lateral omni-directional flow. According to one preferred embodiment the perforations in the fins take the form of elongated slots which serve to provide very high aspect ratio pins which are supported along their outermost ends by a longitudinally extending bar which connects the pin ends together. The width of the bar may, for example, be approximately the same as the width of the pins. Thus supported, the long slender pins resist deformation during the cross-cutting operation. Also, the bar which interconnects the outer ends of the pins serves to improve the heat dissipation characteristics of the heat sink. In general, the perforations of the fins are such that the flow of cooling fluid, such as air, through the fin generally emulates in certain respects the flow of fluid through a comparable pin grid array heat sink.

Where the pins are supported according to the present invention, aspect ratios of from approximately 10:1 to 30:1, more or less, are generally practical to produce. Projection ratios of from approximately 8:1 to 20:1, more or less, are likewise practical to produce. In general, the limitations on the ability to extrude long thin fins, rather than the ability to cross-cut the fins, control the maximum achievable aspect ratios and projection ratios. In general, free flow area ratios in excess of 0.4:1 up to as much as 0.7:1 are preferred. Below approximately 0.4:1 the flow of cooling fluid is significantly inhibited. Above about 0.7:1 the perforated fin may not have sufficient strength or heat dissipating area.

Other objects, advantages, and novel features of the present invention will become apparent from the following detailed description of the invention when considered in conjunction with the accompanying drawings.

BRIEF DESCRIPTION OF THE DRAWINGS

While the description which follows hereinafter is meant to be representative of a number of applications of the invention, it is not exhaustive. As those skilled in the art will recognize, the basic methods and apparatus taught herein can be readily adapted to many uses. It is applicant's intent that this specification and the claims appended hereto be accorded a breadth in keeping with the scope and spirit of the invention being disclosed despite what might appear to be limiting language imposed by the requirements of referring to the specific examples disclosed. Referring particularly to the drawings for the purposes of illustration only and not limitation:

FIG. 7 is a side view of a further embodiment of the invention.

FIG. 8 is a side view of a further embodiment of the invention.

FIG. 9 is a side view of a further embodiment of the invention.

FIG. 10 is a side view of a further embodiment of the invention.

DETAILED DESCRIPTION OF THE PREFERRED EMBODIMENTS

Figure 1:
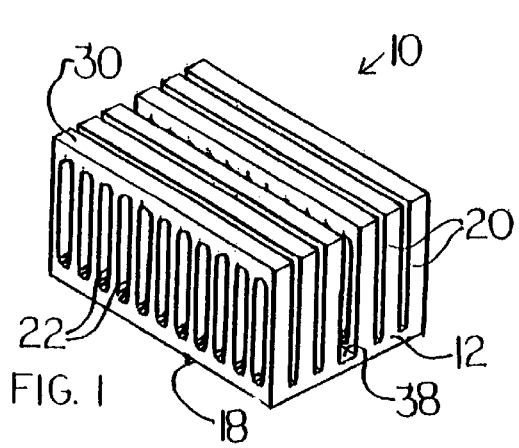
FIG. 1 is an isometric view of a preferred embodiment of a heat sink of the present invention.

Referring now to the drawings wherein like reference numerals designate identical or corresponding parts throughout the several views, there is illustrated generally at 10 a preferred heat dissipating member or heat sink. Heat sink 10 includes, for example, a base 12 which is generally planar in form, and a plurality of perforated panels or fins 20.

Base 12 generally includes a heat receiving surface 14 and a heat discharging surface 16. Heat receiving surface 14 is adapted to being positioned in heat conducting relationship with a heat emitting surface of a conventional chip, package or other electronic component (not shown). Heat from the component enters base 12 at receiving surface 14 and is conducted through base 12 to heat discharging surface 16. The heat generally flows from surface 16 into the fins or pins where it is dissipated from the system.

A positioning stop or ledge 18 is provided on surface 14 so as to aid in mounting heat sink 10 on in the desired position on a component. In order to increase the amount of heat dissipated, the heat sink is often larger than the component which it is intended to cool. Stop 18 serves to position the larger heat sink 10 on the smaller component.

Perforated panels or fins 20 project generally outwardly in a normal direction from heat discharging surface 16. Fins 20 are spaced apart by channels 34. The height of the fins 20 compared to the width of the adjacent channels 34 is generally described as the projection ratio of the fins. Very high fin projection ratios, for example, approximately 10 or 11 to 1 or greater are easily achieved according to the present invention.

Figure 2:
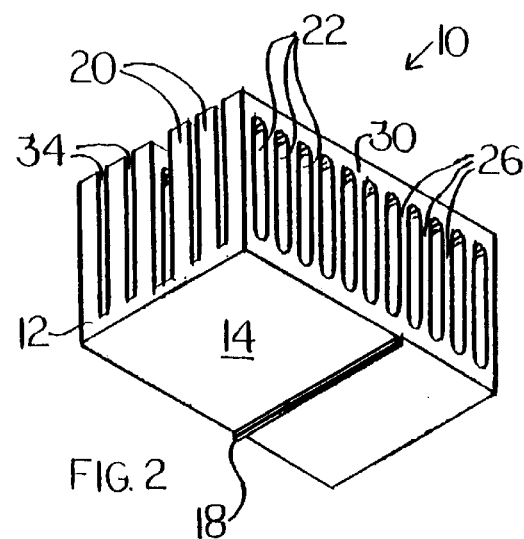
FIG. 2 is an additional isometric view of the embodiment of FIG. 1.
Figure 3:
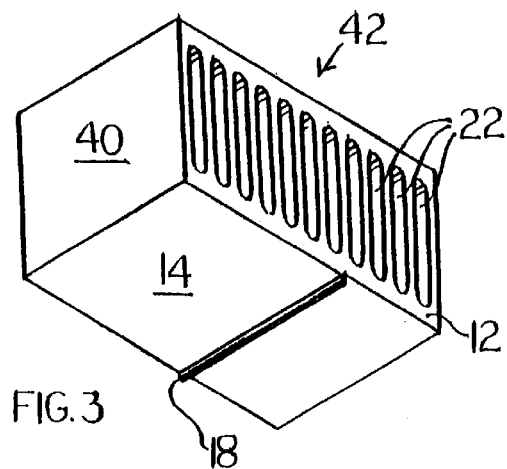
FIG. 3 is an isometric view of the embodiment of FIG. 1 in the blank form before the channels have been formed therein.
Figure 4:
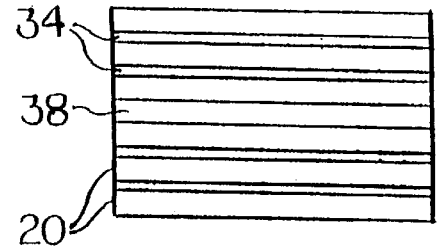
FIG. 4 is a top view of the embodiment of FIG. 1.
Figure 5:
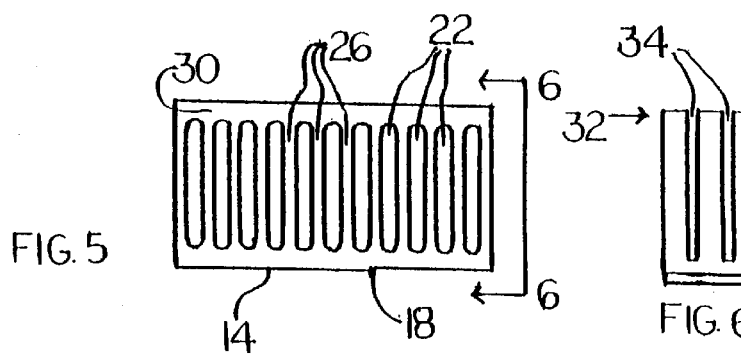
FIG. 5 is a side view of the embodiment of FIG. 1.
Figure 6:
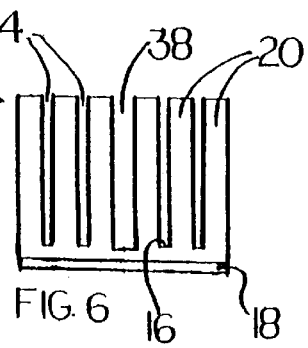
FIG. 6 is a front view of the embodiment of FIG. 1 taken along line 6—6 in FIG. 5.

The panels or fins 20 are perforated so as to allow the flow of cooling fluid through the fins from any lateral direction. The ability to accommodate the lateral omni-directional flow of cooling fluid greatly enhances the utility of the heat sinks according to the present invention. In this respect these heat sinks resemble pin grid array heat sinks, with the added advantage, inter alia, that the high ratios provide substantially improved cooling characteristics. In general, the degree of perforation of the fins is such that the free flow area ratios of the fins are at least 0.4:1. According to one preferred embodiment, illustrated in FIGS. 1–6, the perforations take the form of elongated slots 22 which define bars or pins 26. The fins 20, for example, have aspect ratios of approximately 13 to 1, and preferably from about 10:1 to 20 to 1, projection ratios of approximately 10 to 1, and preferably from about 8 to 1 to 14 to 1, and free flow area ratios of approximately 0.5 to 1, and preferably from about 0.4 to 1 to 0.7 to 1. The widths and heights of the pins 26 and the spacing therebetween are such that the aspect and projection ratios are approximately the same for the pins as for the fins.

The bars or pins 26 are strengthened by longitudinal supporting members extending generally longitudinally of the fins 20 in a region, indicated generally at 32, which is remote from the base 12. Such longitudinal supporting members may, for example, take the form of cross bars 30. Cross bars 30 extend longitudinally in the region of the tops of the fins 20 and serve to support outermost ends of long pins 26 against forces which act, for example, along the fins. Also, the added radiating surface at or near the outermost ends of the pins serves to improve the heat dissipation characteristics of the heat sink 10. For purposes of those embodiments where the perforations take the form of elongated slots which define pins, the aspect ratios of the pins may be considered to be the height of the pins 26, from the heat discharging surface 16 to the top of the fin 20, including the cross bars or other supporting structure, to the width of the bars or pins 26. Very high pin aspect ratios of approximately 13:1 or more are achieved according to the present invention. The aspect ratios of the pins 26 are preferably approximately equal to those of the fins 20. In those embodiments wherein the perforations do not take the form of elongated slots, the free flow area ratios of the fins are generally approximately equal to those which would be attained if pin forming elongated slots were utilized. In general, elongated slots which form pins are preferred to other configurations.

Heat sinks are customarily mounted to heat emitting components by means of, for example, a spring clip (not shown) which clips onto a socket or other underlying structure and bears down resiliently on the heat sink to hold it in heat conductive relationship to the component. A clip receiving groove 38 is provided in the heat sink 12 to accommodate such a conventional spring clip.

Heat sink 12 is conveniently formed by extruding a bar of heat conductive material such as, for example, aluminum, with a cross-section which includes the pattern of perforations which are desired for the fins. In general, the extrusion is hollow with the elongated cavities having the cross-sectional forms which will define the pattern of perforations. A portion of such an extruded blank bar is illustrated generally at 42 in, for example, FIG. 3. The Channels and fins have not yet been formed in blank bar 42. The positioning stop 18 has been formed in the extrusion process. As shown for the purposes of illustration, the blank bar 42 has been cut to the same size as the finished heat sink 10. As will be understood by those skilled in the art, generally it is more efficient to cross-cut the bar before, or concurrently with, trimming it to the finished size. High aspect ratio fins will be formed in blank 42, for example, by sawing or milling laterally from blank end 40 across the blank bar 42. Because the slots 22 are formed in the blank bar 42 during the extrusion process the pins 26 are formed by the cross cutting of blank bar 42. The presence of the pin supporting structure in a region remote from the base 12, which in the embodiment chosen for the purposes of illustration comprises cross bar 30, permits very high aspect ratio fins and pins to be formed without risk of deforming them during the cross-cutting or other forming process. Such high aspect ratio pins and fins have been found to exhibit significant improvements in heat transfer characteristics. The presence of cross bar 30 provides additional surface area from which to dissipate heat which also improves the heat transfer characteristics of the heat sink.

Additional embodiments of the invention are illustrated, for example, in FIGS. 7–10. The patterns of perforations illustrated in these Figs. result from the extrusion process, and thus are present in the blank bar before it is cross-cut.

Referring particularly to FIG. 7, there is illustrated generally at 44 a perforated fin which is perforated with ports of different shapes. An elongated slot 46 is provided in association with circular slots 48. The free flow area ratio in fin 44 is, for example, at least approximately 0.5:1, which is comparable with that of fins provided according to the embodiment of, for example, FIG. 1.

Referring, for example, to FIG. 8, there is illustrated generally at 50 a form of perforated fin in which closed, 52, and open, 54, elongated slots are provided. According to this embodiment, each pair of pins, for example, 56 and 58, is supported longitudinally of the fin 50 by a longitudinally extending bar 60. the pins have an aspect ratio of, for example, 13:1, a projection ratio of, for example, 10:1, and the fins have free flow area ratios of, for example, about 0.5:1. The support which has been found necessary to protect the high aspect ratio pins 56 and 58 from being distorted during the cross-cutting operation is thus provided, but there is greater openness between the pairs of pins.

Referring particularly to FIG. 9, there is illustrated generally at 62 a perforated fin in which the pin supporting structure, cross-member 64, is positioned intermediate the base, 66, and remote, 68, ends of the pins. The pins are asymmetrical with pin 70 being of larger cross-section than the other pins so as to provide additional support for the initiation of the cross-cutting operation. The cross-cutting operation is intended to be initiated from the side 72 where pin 70 is to be formed. This perforated fin profile is advantageous where it is desired to have cooling fluid flowing around the outer ends of the individual pins while still providing very high aspect ratio pins and fins. The free flow area ratio of this embodiment is, for example, about 0.7:1.

Referring particularly to FIG. 10 there is illustrated generally at 74 a perforated fin, the profile of which provides a substantial number of relatively small ports or circular slots 76, with the region which contains the supporting structure being distributed generally throughout the fin. The free flow area ratio of this embodiment is, for example, about 0.4:1.

Obviously many modifications, reversals and transpositions of parts, and variations of the present invention are possible in light of the above teachings. It is therefore to be understood that, within the scope of the appended claims, the invention may be practiced otherwise than as specifically described. What has been described are preferred embodiments in which modifications and changes may be made without departing from the spirit and scope of the accompanying claims.

What is claimed is:

1. A one piece heat dissipating member for removing heat from an electronic component, said one piece heat dissipating member including a base having a heat receiving surface adapted to being mounted in heat receiving relationship with said electronic component, a heat discharging surface generally opposed to said heat receiving surface, a plurality of spaced apart perforated panels projecting generally outwardly from said heat discharging surface and being unsupported except by said base, said panels including outermost ends remote from said base, said panels having an aspect ratio of from approximately 10:1 to 30:1, said perforated panels being continuous in the region of said outermost ends and having a free flow area ratio of from approximately 0.4:1 to 0.7:1.

2. A one piece heat dissipating member of claim 1 wherein said perforated panels include a plurality of elongated perforations, said elongated perforations being defined by a plurality of spaced apart bars extending generally normal to said heat discharging surface.

3. A one piece heat dissipating member of claim 2 wherein said bars have a projection ratio of from approximately 8:1 to 20:1.

4. A one piece heat dissipating member of claim 1 wherein said perforated panels comprise a plurality of spaced apart bars extending generally normal to said heat discharging surface, and a cross bar connecting adjacent spaced apart bars in the region of said outermost ends.

5. A one piece heat dissipating member of claim 1 wherein said perforated panels are spaced apart by channels, and said perforated panels having projection ratios of from approximately 8:1 to 20:1.

6. A one piece heat dissipating member for removing heat from an electronic component, said one piece heat dissipating member including a base having a heat receiving surface adapted to being mounted in heat receiving relationship with said electronic component, a heat discharging surface generally opposed to said heat receiving surface, a plurality of spaced apart perforated panels projecting generally outwardly from said heat discharging surface, terminating in outermost ends, and separated from one another by channels, said heat dissipating member being free of structure other than said base bridging said channels between said perforated panels, said perforated panels including supporting structure positioned in the region of said outermost ends to resist longitudinal deformation of said perforated panels, said perforated panels having an aspect ratio of from approximately 10:1 to 30:1, a projection ratio of from approximately 8:1 to 20:1, and a free flow area ratio of from approximately 0.4:1 to 0.7:1.

7. A one niece heat sink adapted to dissipate heat from an electronic component, said one piece heat sink including a heat receiving base, a plurality of spaced apart free standing heat dissipating perforated fins projecting generally outwardly from said base, terminating in outermost ends, and defining channels therebetween, said perforated fins having an aspect ratio of from approximately 10:1 to 30:1, and a projection ratio of from approximately 8:1 to 20:1, said perforated fins including supporting structure extending longitudinally of said perforated fins in the region of said outermost ends to resist deformation of said perforated fins, and said perforated fins including a plurality of elongated perforations defining pins therebetween, said pins having an aspect ratio of from approximately 10:1 to 30:1 and a projection ratio of from approximately 8:1 to 20:1.

8. A one piece heat sink of claim 7 wherein said pins include outer ends remote from said base, the pins in a heat dissipating perforated fin being joined together in the region of said outer ends by a structure comprising a bar extending generally longitudinally of said heat dissipating perforated fins.

9. A method of making a unitary heat sink adapted to dissipate heat from an electronic component, said heat sink being of a type including a heat receiving base on a first side, and the remote ends of a plurality of spaced apart free standing heat dissipating fins on a second side, said second side being generally opposed to said first side, said heat dissipating fins protecting generally outwardly toward said second side from said base, said heat dissipating fins being perforated in a predetermined pattern, and channels defined between said heat dissipating fins, said method comprising:

extruding an elongated bar of heat conductive material including a plurality of internal elongated cavities having cross-sectional forms which define said predetermined pattern;

cross-cutting said elongated bar across said plurality of internal elongated cavities from said second side towards but not through said base at a plurality of generally parallel spaced apart locations to form said heat dissipating fins; and cross-cutting said elongated bar completely through at locations separated from one another by a predetermined number of said heat dissipating fins to form said heat sink.

10. A method of making a unitary heat sink according to claim 9 including extruding an elongated bar of heat conductive material including a substantially solid second side.

11. A one piece heat dissipating member for removing heat from an electronic component, said one piece heat dissipating member including a base having a heat receiving surface adapted to being mounted in heat receiving relationship with said electronic component, a heat discharging surface generally opposed to said heat receiving surface, a plurality of spaced apart perforated panels projecting generally outwardly from said heat discharging surface and being unsupported except by said base, said panels including outermost ends remote from said base, said panels having an aspect ratio of from approximately 10:1 to 30:1, said perforated panels being continuous in the region of said outermost ends.

12. A one piece heat dissipating member for removing heat from an electronic component, said one piece heat dissipating member including a base having a heat receiving surface adapted to being mounted in heat receiving relationship with said electronic component, a heat discharging surface generally opposed to said heat receiving surface, a plurality of spaced apart perforated panels projecting generally outwardly from said heat discharging surface and being unsupported except by said base, said panels including outermost ends remote from said base, said perforated panels being continuous in the region of said outermost ends and having a free flow area ratio of from approximately 0.4:1 to 0.7:1.

13. A heat dissipating device for mounting to a heat generating electronic component, comprising:
 a) a one piece block of heat conducting material, having:
   a1) a base section designed for attaching to and receiving heat from the heat generating electronic component;
   a2) a perforation with one side being proximate the base section, linearly extending from one side to another side of the block, and being generally parallel to the base section; and
   a3) a cross member section generally opposed to the base section, having a bottom side generally defined by a side of the perforation opposed to the one side; and
   a4) a channel in the block extending generally perpendicular to the perforation from a surface of the block through the cross member section and the perforation, and extending proximate the base section, wherein the channel defines two spaced apart perforated panels projecting generally outwardly from the base section.

14. A heat dissipating device of claim 13 wherein the perforated panels have height to thickness ratios of from approximately 10:1 to 30:1.

15. A heat dissipating device of claim 13 wherein the perforated panels have a free flow area ratio of from approximately 0.4:1 to 0.7:1.

16. A heat dissipating device of claim 13 wherein the perforated panels have height to thickness ratios of from approximately 10:1 to 30:1 and a free flow area ratio of from approximately 0.4:1 to 0.7:1.

\* \* \* \* \*